United States Patent
Kecelioglu et al.

(10) Patent No.: US 9,301,409 B2
(45) Date of Patent: Mar. 29, 2016

(54) MICROWAVE COMPONENT PACKAGE

(71) Applicant: ASELSAN ELEKTRONIK SANAYI VE TICARET ANONIM SIRKETI, Ankara (TR)

(72) Inventors: Galip Kecelioglu, Ankara (TR); Taylan Eker, Ankara (TR); Mustafa Incebacak, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 74 days.

(21) Appl. No.: 14/382,337

(22) PCT Filed: Jan. 25, 2013

(86) PCT No.: PCT/IB2013/050649
§ 371 (c)(1),
(2) Date: Sep. 2, 2014

(87) PCT Pub. No.: WO2013/128305
PCT Pub. Date: Sep. 6, 2013

(65) Prior Publication Data
US 2015/0109752 A1    Apr. 23, 2015

(30) Foreign Application Priority Data
Mar. 2, 2012   (TR) ................ a 2012 02383

(51) Int. Cl.
*H01L 23/66* (2006.01)
*H05K 5/00* (2006.01)

(52) U.S. Cl.
CPC .............. *H05K 5/0091* (2013.01); *H01L 23/66* (2013.01); *H01L 2924/0002* (2013.01)

(58) Field of Classification Search
CPC ................. H05K 5/0091–5/0221; H01L 23/66
See application file for complete search history.

(56) References Cited

U.S. PATENT DOCUMENTS

| 3,731,160 | A | * | 5/1973 | Klein | H01L 23/66 257/664 |
| 4,427,991 | A |   | 1/1984 | Yamamura | |
| 6,335,669 | B1 | * | 1/2002 | Miyazaki | H01L 23/66 174/384 |
| 7,009,106 | B2 | * | 3/2006 | DiPoala | H05K 9/0056 174/377 |
| 7,733,667 | B2 | * | 6/2010 | Qin | H05K 7/142 174/138 E |
| 2008/0180924 | A1 |   | 7/2008 | Shaikh | |
| 2010/0091477 | A1 | * | 4/2010 | Takagi | H01L 23/057 361/820 |

FOREIGN PATENT DOCUMENTS

| EP | 0347398 A1 | 12/1989 |
| JP | 62084603 A | 4/1987 |

* cited by examiner

*Primary Examiner* — Anthony Q Edwards
(74) *Attorney, Agent, or Firm* — Gokalp Bayramoglu

(57) ABSTRACT

The present invention is related to a microwave component packaging technique which ensures that there is no space between component and pocket after inserting the component into pocket. The continuity of ground connections at the microwave gates of the components is provided just compressing the component without using electrically conductive epoxy material.

8 Claims, 2 Drawing Sheets

MICROWAVE COMPONENT PACKAGE

TECHNICAL FIELD

The present invention is related to a microwave component packaging technique which ensures that there is no space between component and pocket after inserting the component into pocket of the package.

PREVIOUS TECHNIQUE

In order to use microwave components, appropriate pockets should be machined in the package. Due to the size tolerances of the component and pocket, gaps occur between component and pocket and these gaps have negative influence on the continuity of ground connections at the gates of the components. In the previous technique, silver-filled electrically conductive epoxy material is filled into gaps to maintain ground continuity and mechanical integrity. However the application in this way consists of various technical problems. These technical problems are as follows:

Although electrically conductive epoxy is used to ensure the ground continuity, epoxy has low level of electrical conductivity value. Especially for microwave components that work on high-frequency band, frequency response is adversely affected from this low electrical conductivity. Also electrical tests of the components are carried out before using. Appropriate test packages are produced for these tests. Since the removal of the component is not possible when they are attached with epoxy. it is not possible to re-use both components and test packages.

In case of failure of microwave components inside the package, it is difficult and in some cases impossible to change the components.

BRIEF DESCRIPTION OF THE INVENTION

The object of the present invention is to realize a microwave package in which gaps between microwave components and pocket are not filled with epoxy material.

Another object of the present invention is to realize a microwave package in which removing and changing of the components are possible and easy in case of necessity.

Another object of the present invention is to realize a microwave package in which more than one component can be tested by using only one test package thanks to the easy removing of components.

DETAILED DESCRIPTION OF THE INVENTION

Figure 1:
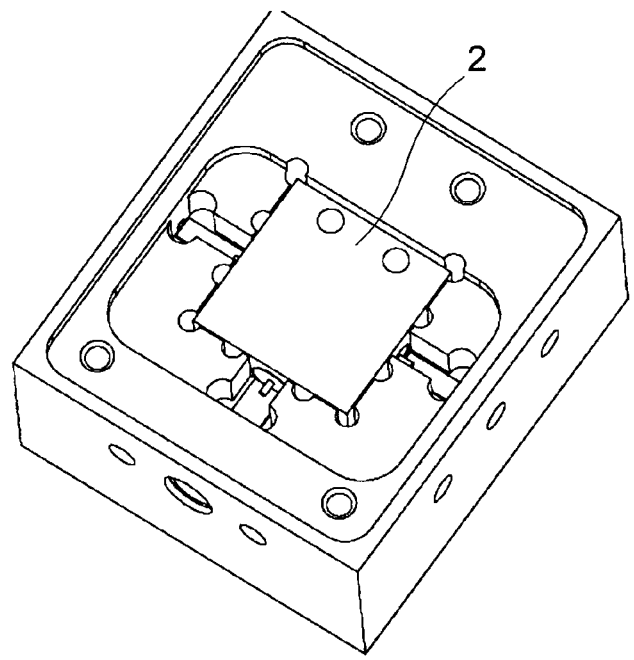

The microwave package which is realized to achieve the aim of this invention is shown in the attached figures. These figures are as follows;

FIG. 1. Perspective view of a microwave component package of previous technique.

Figure 2:
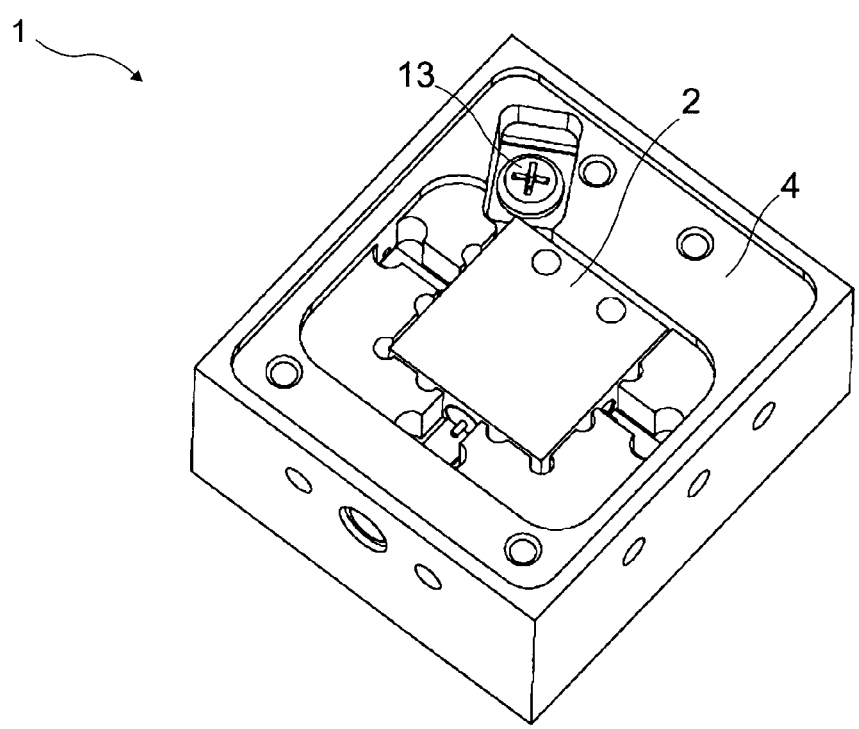

FIG. 2. Perspective view of a microwave component package.

Figure 3:
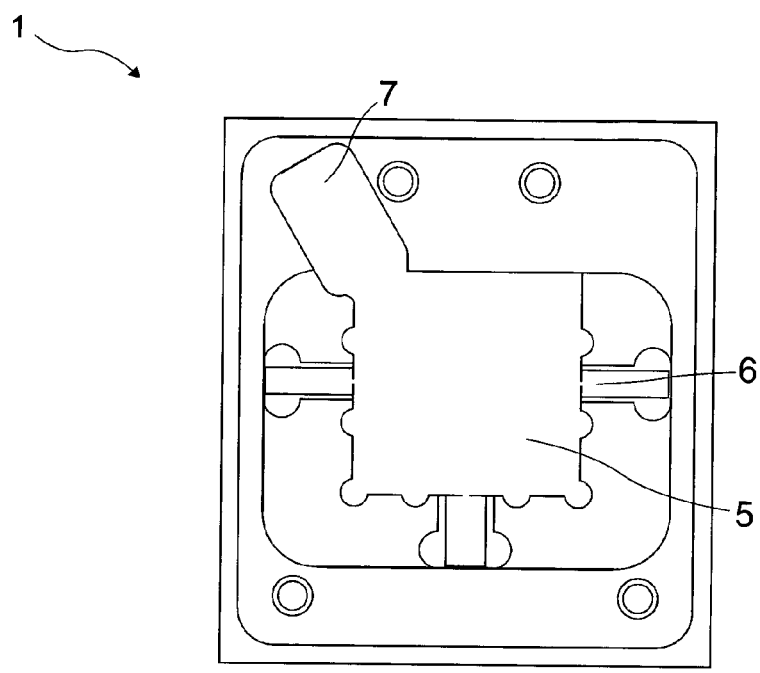

FIG. 3. Top view of a microwave component package.

Figure 4:
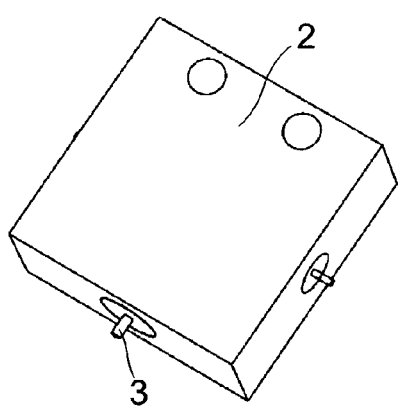

FIG. 4. Top view of a microwave component.

Figure 5:
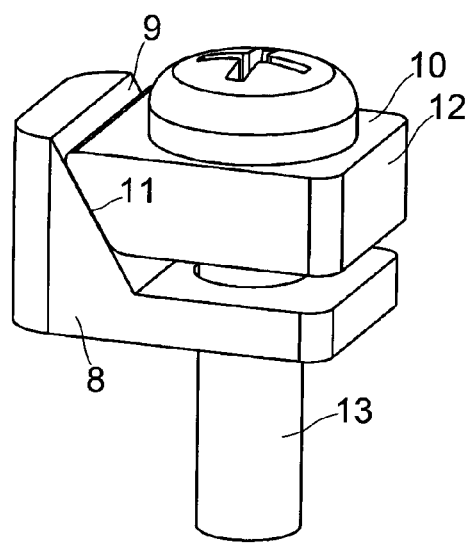

FIG. 5. Perspective view of upper part, lower part and a bolt.

The parts in the figures are numbered one by one and these numbers are given below:
1. A microwave component package
2. A microwave component
3. Microwave gate
4. Housing
5. Component pocket
6. Gate pocket
7. Cavity
8. Lower part
9. Primary plane
10. Upper part
11. Secondary plane
12. Side surface
13. Bolt A microwave component package (1), eliminating the need for conductive epoxy so providing an easier means of usage, basically includes the following,
- A least one microwave component (2) which processes the input signal and if required transmits in a predetermined form,
- At least one microwave gate (3) at at least one edge of a microwave component (2) which provides a means of signal reception and transmission after processing,
- At least one housing (4) which hosts microwave component (2),
- At least one component pocket (5) which situated in the approximately middle of the upper surface of housing (4) and which is formed by recession of upper surface in a predetermined height,
- At least one gate pocket (6) hosting the microwave gates (3) after the placement of microwave component (2) into housing (4),
- At least one cavity (7) on the housing (4) placed nearby one corner of microwave component (2),
- At least one lower part (8) close-fitting into cavity (7) that has a bit much width than that of cavity,
- At least one primary plane (9) at the lower part (8) having a predetermined angle with the earth normal,
- At least one upper part (10) which has the ability to move in left and right direction while being forced to move in up and down direction, so compressing the microwave component (2) in its component pocket (5),
- At least one secondary plane (11) on the upper part (10) which provides parallel movement of upper part (10) over the housing (4) while upper part (10) moves downward by contacting the primary plane (9),
- At least one side surface (12) on the upper part (10) which compresses microwave component (2) by contacting it,
- At least one bolt (13) passing through the holes on lower part (8) and upper part (10), which fastens lower part (8) and upper part (10) and forces the movement of upper part (10) through the microwave component (2) via clockwise screwing and providing a means of compression of microwave component (2).

In one application of the invention, a microwave component (2) is placed into the housing (4). Since the microwave component (2) is a bit smaller than the component pocket (5), there would be gaps between the microwave component (2) and the component pocket (4). This gap has negative influence on the continuity of ground connections at the microwave gates (3) of the components. To solve the problem, a lower part (8) is placed into the cavity (7) on the housing (4). Over the lower part (8) an upper part (10) is placed by which the contact of the primary plane (9) and the secondary plane (11) is accomplished. When the lower part (8) an upper part (10) are placed in the instructed way, the axes of the holes on both parts (8,10) will coincide. A bolt (13) is inserted through the holes when the lower part (8) and upper part (10) are in this position. When the bolt (13) is fixed into the cavity (7), the lower side of the head of the bolt (13) contacts the upper surface of the upper part (10). After this position, screwing the bolt (13) in the clockwise direction forces the upper part (10)

in downward direction. Movement of the upper part (10) in the downward direction forces itself to move in the direction of the microwave component (2) due to the contact of the primary and secondary planes (9,11) and the angular bearing between them. After a while, the side surface (12) of the upper part (10) meets the edge of the microwave component (2). After this contact, screwing the bolt (13) in clockwise direction would make the upper part (10) push the microwave component (2). Continuing in this fashion, the two edges of the microwave element opposite to the corner which contacts the side surface (12) of the upper part (10), meet the walls of the cavity (5) and after this point the microwave component (2) does not have the ability to move further. At this position continuity of ground connections of the microwave gates (3) of the components is established without using epoxy material.

It is possible to extend the applications of this microwave component package (1), so it cannot be bounded by examples, but it can be explained by claims.

The invention claimed is:

1. A microwave component package, eliminating the need for conductive epoxy and providing an easier means of usage, comprising:
    at least one microwave component which processes an input signal and transmits the input signal in a predetermined form if required;
    at least one microwave gate or at least one edge of the microwave component which provides a means of signal reception and transmission processing;
    at least one housing which hosts the microwave component;
    at least one component pocket which situated in the approximately middle of an upper surface of the housing and which is formed by recession of upper surface in a predetermined height;
    at least one gate pocket hosting the microwave gate after a placement of microwave component into housing; and
    at least one cavity on the housing placed nearby one corner of microwave component;
    at least one lower part closely-fitting into the cavity that has a bit much width than that of the cavity;
    at least one primary plane at the lower part having a predetermined angle with the horizon;
    at least one upper part which has the ability to move in left and right direction while being forced to move in up and down direction, so compressing the microwave component in its component pocket;
    at least one secondary plane on the upper part which provides parallel movement of the upper part over the housing while the upper part moves downward by contacting the primary plane;
    at least one side surface on the upper part which compresses microwave component by contacting it;
    at least one bolt passing through the holes on lower part and upper part, which fastens lower part and upper part and forces the movement of upper part through the microwave component via clockwise screwing and providing a means of compression of microwave component.

2. The microwave component package of claim 1, wherein the lower part is inserted into the cavity in the housing.

3. The microwave component package of claim 1, wherein the upper part is placed over the lower part to provide surface to surface contact between primary and secondary planes.

4. The microwave component package of claim 1, wherein a bolt is fixed through lower and upper parts when their hole axis coincide.

5. The microwave component package of claim 1, wherein the bolt whose head's lower surface contacts to the upper surface of upper part when the bolt is inserted into the cavity.

6. A microwave component package of claim 1, wherein the upper part moves downward and at the same time through the direction of microwave component when the bolt is screwed by turning in clockwise direction.

7. The microwave component package of claim 1, wherein the upper part moves downward and at the same time through the direction of microwave component due to the angular contact between the primary and secondary planes.

8. A microwave component package of claim 1, wherein a side surface contacts the corner of microwave component after the motion of upper part through downward direction.

\* \* \* \* \*